United States Patent [19]

Wheeler

[11] Patent Number: 4,654,544
[45] Date of Patent: Mar. 31, 1987

[54] DARLINGTON TRANSISTOR DRIVER WITH REVERSE BASE DRIVE CURRENT

[75] Inventor: Harry L. Wheeler, Birmingham, Ala.

[73] Assignee: Combustion Engineering, Inc., Windsor, Conn.

[21] Appl. No.: 797,329

[22] Filed: Nov. 12, 1985

[51] Int. Cl.[4] .......................... H03K 3/01; H03K 3/26; H03K 3/33

[52] U.S. Cl. ................................... 307/270; 307/300; 307/310; 307/315

[58] Field of Search ............... 307/315, 300, 254, 255, 307/310, 270

[56] References Cited

U.S. PATENT DOCUMENTS 4,011,470 3/1977 Davis et al. ..................... 307/315
4,414,479 11/1983 Foley ............................. 307/315

Primary Examiner—John S. Heyman
Assistant Examiner—B. P. Davis
Attorney, Agent, or Firm—David L. Smith

[57] ABSTRACT

A transistorized power switching circuit for controlling the conductive state of a Darlington transistor. The circuit, driven by a single signal driver, operates to switch the Darlington transistor from a conducting state to a nonconducting state as well as from a nonconducting state to a conducting state. The circuit minimizes the number of components in the circuit that introduce time delays in switching the Darlington transistor. To further enhance switching the Darlington transistor from a conducting state to a nonconducting state, a reverse bias is employed to sweep the charge back out through the base of the Darlington transistor rather than permitting the charge to pass through the Darlington transistor then to the load. The reverse bias is maintained on the Darlington transistor for the duration of the off time regardless of the duration of the off period.

14 Claims, 1 Drawing Figure

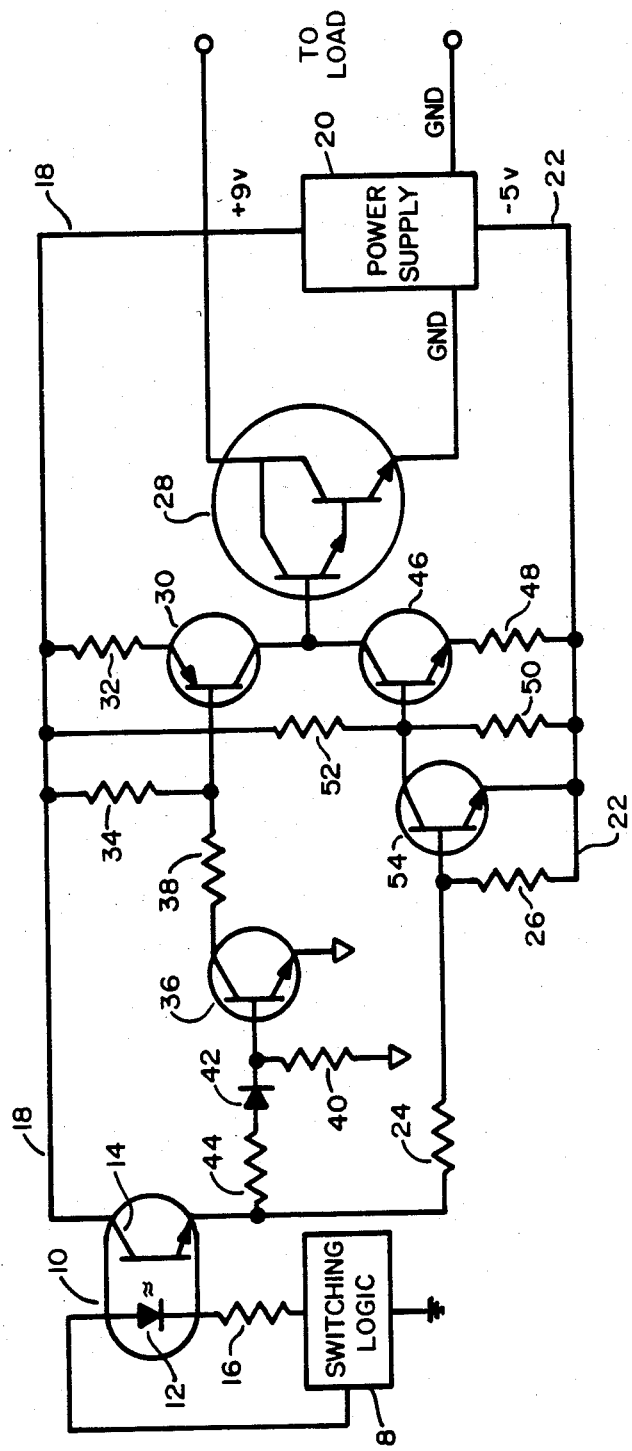

4,654,544

DARLINGTON TRANSISTOR DRIVER WITH REVERSE BASE DRIVE CURRENT

BACKGROUND OF THE INVENTION

This invention relates to a transistorized power switch and base drive circuit therefor and in particular to a transistorized power switching circuit for controlling the conductive state of a Darlington transistor that provides a constant reverse base drive to switch the Darlington transistor to a nonconductive state wherein the number of components in the switching circuit that introduce time delays is minimized.

Advances in high power transistors has opened new applications in power electronics for transistors that were previously dominated by other solid state switches such as the silicon controlled rectifier. Power transistors have the advantages of higher frequency application, low switching losses and relatively simple commutation schemes as compared to the silicon controlled rectifier. High power transistors are now finding application in motor drives, inverters, uninterrupted power supplies and converters. In many applications the high power transistor employed is a power Darlington transistor. Power Darlington transistors are available that provide a collector to emitted operating voltage of 1000 volts at up to 300 amps to drive a load. The power Darlington transistor however does not achieve the switching speed performance of a lower current, narrow-base-width, transistor. The physical width of the base in a power Darlington must be increased for the power transistor to support higher voltages and currents. Increasing the base width lowers the current gain and therefore to provide the high gain desired a power Darlington configuration is employed.

The relatively poor switching performance of a conventional high powered Darlington transistor is most recognizable during the turn-off period. The relatively slow turn-off is due to the time required for charge entering the base of the first transistor in the Darlington pair passing through the first transistor thence through the second transistor of the Darlington pair to the load.

As an alternative to permitting the charge entering the base of the first transistor of the Darlington pair passing through the first transistor thence the second transistor of the Darlington pair to the load, an effective reverse bias may be used to drive the charge entering the base of the first transistor of the Darlington pair at the instant the Darlington transistor is being turned off back out through the base region of the first transistor of the Darlington pair. Most schemes developed to improve the slow turn-off of Darlington transistors employ five or six transistors each introducing a time delay or alternatively requiring two signal drivers to switch the Darlington transistor to a conductive or nonconductive state.

Various schemes have been developed to turn-off a power Darlington transistor more rapidly. Some of the schemes employ capacitors or inductors. Others require two power supplies such as a positive and negative power supply. What is needed is a circuit for switching a power Darlington transistor to the conducting or nonconducting states that minimizes the number of circuit components in which a time delay may be introduced while concomitantly providing a base drive that permits the full on time and delivers reverse biasing to the Darlington transistor during the full off time regardless of how long the off time is.

SUMMARY OF THE INVENTION

The present invention provides a power switching circuit for controlling the conductive state of a three terminal Darlington transistor that permits the full on time of the Darlington transistor and delivers a reverse bias to the base of the Darlington transistor during the full off time, regardless of how long the off time period is. A signal driver is used to isolate the logic that determines when to change the state of the Darlington transistor from the power switching circuit. The same signal driver current is employed to operate two transistor pairs. The first pair of transistors switches the Darlington transistor to a conducting state upon activation by the signal driver current. Simultaneously, the signal driver current deactivates a second transistor pair that is employed to switch the Darlington transistor to a nonconducting state. Upon the absence of signal driver current, the first transistor pair is deactivated thereby removing base drive current from the Darlington transistor. Simultaneously, one of the transistors of the second transistor pair switches state applying a reverse bias voltage to the Darlington transistor to sweep out the charge in the base region thereby more rapidly turning off the Darlington transistor. The reverse bias voltage is applied to the Darlington transistor continuously for the duration of the off time. When the logic driving the signal driver indicates it is time to turn the Darlington transistor on again, the signal driver current initiates the changing of the state of both transistors in the second transistor pair providing reverse bias to the Darlington transistor thereby removing the reverse bias. Simultaneously, the signal driver current changes the state of both transistors of the first transistor pair thereby providing base drive to the Darlington transistor. A unidirectional current flow means is employed between the first pair of transistors that provide base drive to the Darlington transistor and the signal driver so as to prevent the second pair of transistors from applying a reverse bias to the Darlington transistor when the signal driver is providing no current.

BRIEF DESCRIPTION OF THE DRAWING

The FIGURE is a schematic diagram of a power switching circuit for controlling the conductive state of a Darlington transistor designed in accordance with the present invention.

DESCRIPTION OF THE PREFERRED EMBODIMENT

Referring to the drawing, there is depicted therein a power switching circuit for controlling the conductive state of a Darlington transistor designed in accordance with the present invention. A power Darlington transistor switching circuit would be employed in such applications as motor control, inverters, converters and uninterruptable power supplies. One such power switching circuit would be employed for each of the Darlington transistors that are utilized in an application. A typical three phase inverter would require six such circuits, one for each Darlington transistor providing each half of the three phase power. The power switching circuit is activated by signal driver 10 which acts as an isolation means to isolate the logic signal, generated by switching logic 8, to switch the state of the Darlington transistor from the power switching or drive circuit. Signal driver 10 could be any isolation means such as a pulse transformer or optic coupler. In the preferred embodiment, signal driver 10 is an optic coupler having LED 12 optically coupled to light activated transistor 14. Current limiting resistor 16 limits the current passing through light emitting diode 12. The anode of light emitting diode 12 is coupled to a power source within switching logic 8. When light emitting diode 12 conducts current, the light emitted by light emitting diode 12 provides base current to light activated transistor 14 thereby switching light activated transistor 14 to a conducting state. The collector of light activated transistor 14 is connected to positive voltage bus 18 from power supply 20. The emitter of light activated transistor 14 is connected to a negative voltage bus 22 of power supply 20 through series resistors 24 and 26. The load driven by Darlington transistor 28 is typically connected between the collector and emitter thereof, the emitter having a common ground with power supply 20. The base drive to Darlington transistor 28 is provided by a pair of bipolar transistors. Transistor 30 is a PNP transistor having the collector coupled to the base of Darlington transistor 28. The emitter of transistor 30 is coupled to positive voltage bus 18 through resistor 32. The base of transistor 30 is also coupled to positive voltage bus 18 through resistor 34. The common point between the base of transistor 30 and resistor 34 is coupled to the collector of transistor 36 through resistor 38. The emitter of transistor 36 is grounded to signal ground. The base of transistor 36 is also coupled to signal ground through resistor 40.

The base of transistor 36 is coupled to the cathode of diode 42. The anode of diode 42 is coupled to the emitter of light activated transistor 14 of signal driver 10 through resistor 44.

The reverse bias voltage applied to Darlington transistor 28 is applied through a second transistor pair. The collector of transistor 46 is coupled to the base of Darlington transistor 28. The emitter of transistor 46 is coupled to negative voltage bus 22 of power supply 20 through resistor 48. The base of transistor 46 is coupled to negative voltage bus 22 through resistor 50. Resistor 52 is coupled between positive voltage bus 18 and the base of transistor 46. Also coupled to the base of transistor 46 is the collector of transistor 54. The emitter of transistor 54 is coupled to negative voltage bus 22 as is the base of transistor 54 through resistor 26.

Energizing signal driver 10 such as by grounding current limiting resistor 16 provides base current for both transistor 36 and transistor 54. Transistor 36 is switched from the off state to the on state by the signal driver provided base current through current limiting resistor 44 and diode 42. The collector current from transistor 36 provides base current for PNP transistor 30 thereby switching transistor 30 from the off state to the on state which in turn provides the base current to Darlington transistor 28 by way of the collector of transistor 30, resistor 32 and positive voltage bus 18. Transistor 32 base current is limited by current limiting resistor 38.

Signal driver 10 providing base current to transistor 54 through current limiting resistor 24 switches transistor 54 from the nonconducting to and maintains transistor 54 in the conducting state. With transistor 54 in the conducting state the base of transistor 46 is essentially maintained at the voltage of negative voltage bus 22 as the collector to emitter saturation voltage of transistor 54 is much less than the base to emitter saturation voltage of transistor 46. When transistor 54 and transistor 46 are identical, the transistor selected must have a very high base to emitter saturation voltage relative to the collector to emitter saturation voltage. Thus, transistor 46 is maintained in the off state for the duration of the presence of signal driver 10 current which coincides with the duration of Darlington transistor 28 drive current being provided by transistors 30 and 36.

When signal driver 10 current is absent Darlington transistor 28 is switched to and maintained in the off state. Upon cessation of signal driver 10 current transistor 36 is switched to and maintained in the off state as base current to transistor 36 ceases. Transistor 36 switching to the off state in turn switches transistor 30 to the off state thereby terminating base drive to Darlington transistor 28. With transistor 36 switched to the off state, resistor 40 ties the base of transistor 36 to substantially the potential of the emitter of transistor 36, which in this case is ground, to assure that in the absence of base drive, transistor 36 does not switch to the on state with no base current provided to transistor 36 through base current limiting resistor 44. In the absence of base drive and without the base loading provided by resistor 40, transistor 36 could be turned on by leakage current. Similarly, resistor 34 ties the base of transistor 30 to substantially the potential of the emitter of transistor 30 which is the voltage of positive voltage bus 18, to assure that transistor 30 is not turned on by leakage current as may occur in the absence of base drive and without the base loading provided by resistor 34.

The absence of signal driver 10 current also causes the cessation of transistor 54 base drive current as limited by resistor 24. Removing base drive current from transistor 54 causes transistor 54 to switch from the conducting state to the nonconducting state. Resistor 26 ties the base of transistor 54 to substantially the same potential as the emitter of transistor 54, which in the preferred embodiment is the voltage of negative voltage bus 22, to assure that transistor 54 does not turn on in the absence of base drive and without base loading.

Transistor 54 switching to the off state permits the voltage at the common point between resistor 50 and resistor 52 to return to the voltage as established by the voltage across resistor 48 plus the base to emitter voltage of transistor 46. The voltage at the base of transistor 46 with transistor 54 in the off-state is the divided voltage at the common point between resistors 50 and 52 of a voltage divider network coupled between positive voltage bus 18 and negative voltage bus 22. The voltage divider network is comprised of resistor 52 in series with the parallel combination of resistor 50 and, resistor 48 in series with the base to emitter voltage of transistor 46. Simultaneously, with transistor 54 switching to the off state, the base of transistor 46 is no longer tied to substantially the same potential as the emitter of transistor 46 thereby permitting a base current from positive voltage bus 18 through and as limited by resistor 52 to the base of transistor 46 thereby switching transistor 46 from the off state to the on state. Switching transistor 46 to the on state occurs simultaneously with switching transistor 30 off and provides a reverse bias to the base of Darlington transistor 28 for the duration of the off time regardless of the duration of the off period.

The voltage on negative voltage bus 22 is selected to be less than the rated negative voltage of Darlington transistor 28 with an allowance to provide a safety margin therebetween. The negative bias on the base of Darlington transistor 28 is maintained through the collector and emitter of transistor 46, now switched to and maintained in a conducting state, through current limiting resistor 48 to negative voltage bus 22.

Although it is desirable to remove saturated charge from the base of Darlington transistor 28 rapidly, to do so very rapidly and create a reverse bias current that exceeds the forward bias current of Darlington transistor 28 during normal operation causes deterioration of the Darlington transistor such that a derating is necessitated. To obviate necessitating a derating, resistor 48 limits the reverse bias current so as not to exceed the forward bias current of Darlington transistor 28. Limiting the magnitude of the reverse bias base current to the magnitude of the forward bias base current the safe operating region of Darlington transistor 28 has not been impacted.

The forward bias base current of Darlington transistor 28 is determined by current limiting resistance 32 between the base of Darlington transistor 28 and positive voltage bus 18. In the preferred embodiment, resistor 32 is between the emitter of transistor 30 and voltage bus 18. Similarly, the reverse bias base current of Darlington transistor 28 is determined by current limiting resistor 48 between the base of Darlington transistor 28 and negative voltage bus 22. In the preferred embodiment, resistor 48 is between the emitter of transistor 46 and voltage bus 22. Typical resistance values used in the power switching circuit of the preferred embodiment are shown in Table 1.

TABLE 1

| COMPONENT REFERENCE NUMERAL | RESISTANCE IN OHMS |
|---|---|
| 24 | 1000 |
| 26 | 100 |
| 32 | 18 |
| 34 | 100 |
| 38 | 33 |
| 40 | 100 |
| 44 | 330 |
| 48 | 4.7 |
| 50 | 100 |
| 52 | 220 |

In this manner, diode 42 permits transistors 36 and 54 to operate from a single signal driver 10. In the absence of signal driver 10 current, diode 42 prevents current from flowing from signal ground through resistors 40, 44, and 24 to switch transistor 54 on erroneously. When signal driver current is present transistor 30 operates in the conducting state and transistor 46 operates in the nonconducting state. In the absence of signal driver 10 current, transistor 30 operates in the nonconducting state and transistor 46 operates in the conducting state. A negative emitter-to-base voltage is maintained on Darlington transistor 28 absent a signal to turn on Darlington transistor 28 by a switching circuit that minimizes the number of components that may introduce a time delay in switching. The negative base voltage is limited not to exceed the rated negative voltage of the Darlington transistor.

It is understood that the Figure is illustrative and that variations in the design of the power switching circuit are within the scope of the invention. Variations may include but are not limited to placing resistors 32 and 46 between the collector of the respective transistors and the base of Darlington transistor 28; placing resistor 38 between the emitter of transistor 36 in ground; replacing diode 42 with a silicon controlled rectifier which receives a gate signal such as based on signal driver 10 current to switch the silicon controlled rectifier to the conducting state or replacing resistors 32 and 48 with a single impedance between the base of Darlington transistor 28 and the common point between transistors 30 and 46 with the single impedance providing both the forward and reverse Darlington transistor 28 base current limiting function.

I claim:

1. A power switching circuit for controlling the conductive state of a three terminal, including a base, Darlington transistor that provides a constant reverse base drive to switch the Darlington transistor to a nonconductive state, comprising:
    (a) a signal driver
    (b) a first transistor pair for switching the Darlington transistor to a conducting state, each of the first and second transistors of the first transistor pair having a base, an emitter and a collector,
        (i) the first transistor of the first transistor pair having the emitter coupled to a first voltage bus, the collector coupled to the base of the Darlington transistor and the base coupled to the second transistor of the first transistor pair,
        (ii) the second transistor of the first transistor pair having the collector coupled to the base of the first transistor of the first transistor pair, the emitter coupled to signal ground and the base coupled to the signal driver;
    (c) means interposed between the base of the second transistor of the first transistor pair and the signal driver for preventing current flow from the base of the second transistor of the first transistor pair to the signal driver; and
    (d) a second transistor pair for switching the Darlington transistor to a nonconducting state, each of the first and second transistors of the second transistor pair having a base, an emitter and a collector,
        (i) the first transistor of the second transistor pair having the emitter coupled to a second voltage bus, the collector coupled to the base of the Darlington transistor and the base coupled to the collector of the second transistor of the second transistor pair,
        (ii) the second transistor of the second transistor pair having the collector coupled to the base of the first transistor of the second transistor pair, the emitter coupled to the second voltage bus and the base coupled to the signal driver, whereby when the signal driver indicates the Darlington transistor should be turned on the first transistor pair operates to switch the Darlington transistor to a conducting state by providing base current thereto concomitantly the second transistor pair ceases providing a reverse bias, and when the signal driver indicates the Darlington transistor should be turned off the second transistor pair operates to switch the Darlington transistor to a nonconducting state by providing a reverse bias to the Darlington transistor concomitantly the first transistor pair ceases providing base current to the Darlington transistor.

2. A power switching circuit as recited in claim 1 wherein the first voltage bus is a positive voltage bus and the second voltage bus is a negative voltage bus.

3. A power switching circuit as recited in claim 2 further comprising means for limiting the base current of one of the transistors.

4. A power switching circuit as recited in claim 2 further comprising means for tying the base of one of the transistors to the potential of the emitter of the transistor upon cessation of base current to the transistor.

5. A power switching circuit as recited in claim 2 further comprising an impedance means interposed between the base of the Darlington transistor and the first voltage bus for limiting the base current of the Darlington transistor during forward bias.

6. A power switching circuit as recited in claim 5 wherein the impedance means is interposed between the emitter of the first transistor of the first transistor pair and the first voltage bus.

7. A power switching circuit as recited in claim 2 further comprising an impedance means interposed between the base of the Darlington transistor and the second voltage bus for limiting the base current of the Darlington transistor during reverse bias.

8. A power switching circuit as recited in claim 7 wherein the impedance means is interposed between the emitter of the first transistor of the second transistor pair and the second voltage bus.

9. A power switching circuit for controlling the conductive state of a three terminal, including a base, Darlington transistor that provides a constant reverse base drive to switch the Darlington transistor to a nonconductive state, comprising:
(a) a signal driver;
(b) a first transistor pair for switching the Darlington transistor to a conducting state, each of the first and second transistors of the first transistor pair having a base, an emitter and a collector,
 (i) the first transistor of the first transistor pair having the emitter coupled to a positive voltage bus, the collector coupled to the base of the Darlington transistor and the base coupled to the second transistor of the first transistor pair,
 (ii) the second transistor of the first transistor pair having the collector coupled to the base of the first transistor of the first transistor pair, the emitter coupled to signal ground and the base coupled to the signal driver;
(c) means interposed between the base of the second transistor of the first transistor pair and the signal driver for preventing current flow from the base of the second transistor of the first transistor pair means to the signal driver;
(d) a second transistor pair for switching the Darlington transistor to a nonconducting state, each of the first and second transistors of the second transistor pair having a base, an emitter and a collector,
 (i) the first transistor of the second transistor pair having the emitter coupled to a negative voltage bus, the collector coupled to the base of the Darlington transistor and the base coupled to the collector of the second transistor of the second transistor pair,
 (ii) the second transistor of the second transistor pair having the collector coupled to the base of the first transistor of the second transistor pair, the emitter coupled to the negative voltage bus and the base coupled to the divided voltage point of the second voltage divider means;
(e) means for limiting the base current of each of the first pair of transistors and each of the second pair of transistors; and
(f) means for tying the base of each of the first pair of transistors and each of the second pair of transistors to the potential of the emitter of the respective transistor upon cessation of base current to the transistor, whereby when the signal driver indicates the Darlington transistor should be turned on the first transistor pair operates to switch the Darlington transistor to a conducting state by providing base current thereto concomitantly the second transistor pair ceases providing a reverse bias, and when the signal driver indicates the Darlington transistor should be turned off the second transistor pair operates to switch the Darlington transistor to a nonconducting state by providing a reverse bias to the Darlington transistor concomitantly the first transistor pair ceases providing base current to the Darlington transistor.

10. A power switching circuit as recited in claim 9 further comprising an impedance means interposed between the base of the Darlington transistor and the positive voltage bus for limiting the base current of the Darlington transistor during forward bias.

11. A power switching circuit as recited in claim 10 wherein the impedance means is interposed between the emitter of the first transistor of the second transistor pair and the positive voltage bus.

12. A power switching circuit as recited in claim 9 further comprising an impedance means interposed between the base of the Darlington transistor and the negative voltage bus for limiting the base current of the Darlington transistor during reverse bias.

13. A power switching circuit as recited in claim 12 wherein the impedance means is interposed between the emitter of the first transistor of the second transistor pair and the negative voltage bus.

14. A power switching circuit for controlling the conductive state of a three terminal, including a base, Darlington transistor that provides a constant reverse base drive to switch the Darlington transistor to a nonconductive state, comprising:
(a) a signal driver;
(b) a first transistor pair for switching the Darlington transistor to a conducting state, each of the first and second transistors of the first transistor pair having a base, an emitter and a collector, the collector of the first transistor of the first transistor pair coupled to the base of the Darlington transistor, the emitter of the first transistor coupled to a positive voltage bus, the base of the first transistor coupled to the second transistor of the first transistor pair, the emitter of the second transistor of the first transistor pair coupled to ground, the base of the second transistor of the first transistor pair coupled to the signal driver and the collector of the second transistor coupled to the base of the first transistor;
(c) means interposed between the base of the second transistor of the first transistor pair and the signal driver for preventing current flow from the base of the second transistor of the first transistor pair to the signal driver;
(d) impedance means between the emitter of the first transistor of the first transistor pair and the positive voltage bus for limiting the base current of the Darlington transistor during forward bias;

(e) a second transistor pair for switching the Darlington transistor to a nonconducting state, each of the first and second transistors of the second transistor pair having a base, an emitter and a collector, the collector of the first transistor of the second transistor pair coupled to the base of the Darlington transistor, the base of the first transistor coupled to the collector of the second transistor of the second transistor pair, the emitter of the first transistor of the second transistor pair coupled to a negative voltage bus, the emitter of the second transistor of the second transistor pair coupled to the negative voltage bus, the base of the second transistor of the second transistor pair coupled to the signal driver and the emitter of the second transistor of the second transistor pair is coupled to the negative voltage bus;

(f) impedance means between the emitter of the first transistor of the second transistor pair and the negative voltage bus for limiting the reverse base current of the Darlington transistor during reverse bias;

(g) means for limiting the base current of each of the first pair of transistors and each of the second pair of transistors; and (h) means for tying the base of each of the first pair of transistors and each of the second pair of transistors to the potential of the emitter of the respective transistor upon cessation of base current to the transistor, whereby when the signal driver indicates the Darlington transistor should be turned on the first transistor pair operates to switch the Darlington transistor to a conducting state by providing base current thereto concomitantly the second transistor pair ceases providing a reverse bias, and when the signal driver indicates the Darlington transistor should be turned off the second transistor pair operates to switch the Darlington transistor to a nonconducting state by providing a reverse bias to the Darlington transistor concomitantly the first transistor pair ceases providing base current to the Darlington transistor.

* * * * *